United States Patent
Xiang et al.

(10) Patent No.: US 12,093,616 B1
(45) Date of Patent: Sep. 17, 2024

(54) METHOD AND SYSTEM FOR SHIP STABILITY PREDICTION BY WEIGHTED FUSION OF RADIAL BASIS FUNCTION NEURAL NETWORK AND RANDOM FOREST BASED ON GRADIENT DESCENT

(71) Applicant: HUAZHONG UNIVERSITY OF SCIENCE AND TECHNOLOGY, Hubei (CN)

(72) Inventors: Xianbo Xiang, Hubei (CN); Chaicheng Jiang, Hubei (CN); Gong Xiang, Hubei (CN); Shaolong Yang, Hubei (CN); Qin Zhang, Hubei (CN)

(73) Assignee: HUAZHONG UNIVERSITY OF SCIENCE AND TECHNOLOGY, Hubei (CN)

(*) Notice: Subject to any disclaimer, the term of this patent is extended or adjusted under 35 U.S.C. 154(b) by 0 days.

(21) Appl. No.: 18/585,089

(22) Filed: Feb. 23, 2024

(30) Foreign Application Priority Data

Dec. 31, 2022 (CN) .......................... 202211737520.1

(51) Int. Cl.
*G06F 30/27* (2020.01)
*B63B 39/00* (2006.01)
(Continued)

(52) U.S. Cl.
CPC .............. *G06F 30/27* (2020.01); *B63B 39/00* (2013.01); *B63B 71/00* (2020.01); *G06N 3/09* (2023.01); *B63B 43/04* (2013.01)

(58) Field of Classification Search
None
See application file for complete search history.

(56) References Cited

U.S. PATENT DOCUMENTS 10,410,118 B2 * 9/2019 Xiong ...................... G06N 3/08
2017/0024642 A1 1/2017 Xiong et al.

FOREIGN PATENT DOCUMENTS

| CN | 109508470 | 3/2019 |
| CN | 110298611 | 10/2019 |

(Continued)

OTHER PUBLICATIONS

Jiang, Chaicheng et al., "Study of ship stability prediction based on neural network", Journal of Dalian University of Technology, Sep. 2023, with English abstract, pp. 518-523, vol. 63, No. 5.

(Continued)

*Primary Examiner* — Leigh M Garbowski
(74) *Attorney, Agent, or Firm* — JCIPRNET

(57) ABSTRACT

A method and a system for ship stability prediction by weighted fusion of RBFNN and random forest based on GD are provided. Firstly, input characteristics when predicting failure probabilities under different failure modes are determined through prior knowledge. Secondly, a mean square error of k-fold cross-validation is used as performance evaluation criterion of the RBFNN and the RF to search for model capacities of the RBFNN and the RF. Then, network parameters of the RBFNN are updated. Multiple random sample sets are generated using a bootstrap sampling method and are parallelly trained to generate multiple regression trees. A Gini index is used as an attribute division index, and a prediction result of the random forest is obtained. Finally, weight coefficients are introduced for weighted fusion of prediction results of the RBFNN and the RF. The weight coefficient is obtained by solving through iterative optimization of the gradient descent.

14 Claims, 1 Drawing Sheet

(51) Int. Cl.
  *B63B 71/00*  (2020.01)
  *G06N 3/09*   (2023.01)
  *B63B 43/04*  (2006.01)

(56) References Cited

FOREIGN PATENT DOCUMENTS

| CN | 110298611 A | * | 10/2019 | ........... G06Q 10/083 |
|----|-------------|---|---------|-------------------------|
| CN | 111628531   |   | 9/2020  |                         |
| CN | 111723949   |   | 9/2020  |                         |
| CN | 111797474 A | * | 10/2020 | ............. G06F 30/15 |
| CN | 115115079   |   | 9/2022  |                         |
| CN | 115422656 A | * | 12/2022 | ............... G06N 3/04 |

OTHER PUBLICATIONS

Li, Lang "Wind Pressure Prediction of High Rise Buildings Based on Machine Learning", Master's thesis of Guangzhou University, May 31, 2021, with English abstract, pp. 1-120.

Cui, Xunlong, "Prediction of Individual Travel Behavior Based on Data Mining Algorithms", A Dissertation Submitted for the Degree of Master of Anhui University, Apr. 2021, with English abstract, pp. 1-77.

Ganggang Zuo, "The Research of Wei River Runoff Prediction System Based on Machine Learning", Master's thesis of Xi'an University of Technology, Jul. 2017, with English abstract, pp. 1-104.

"Office Action of China Counterpart Application", issued on Oct. 31, 2023, with English translation thereof, p. 1-p. 11.

\* cited by examiner

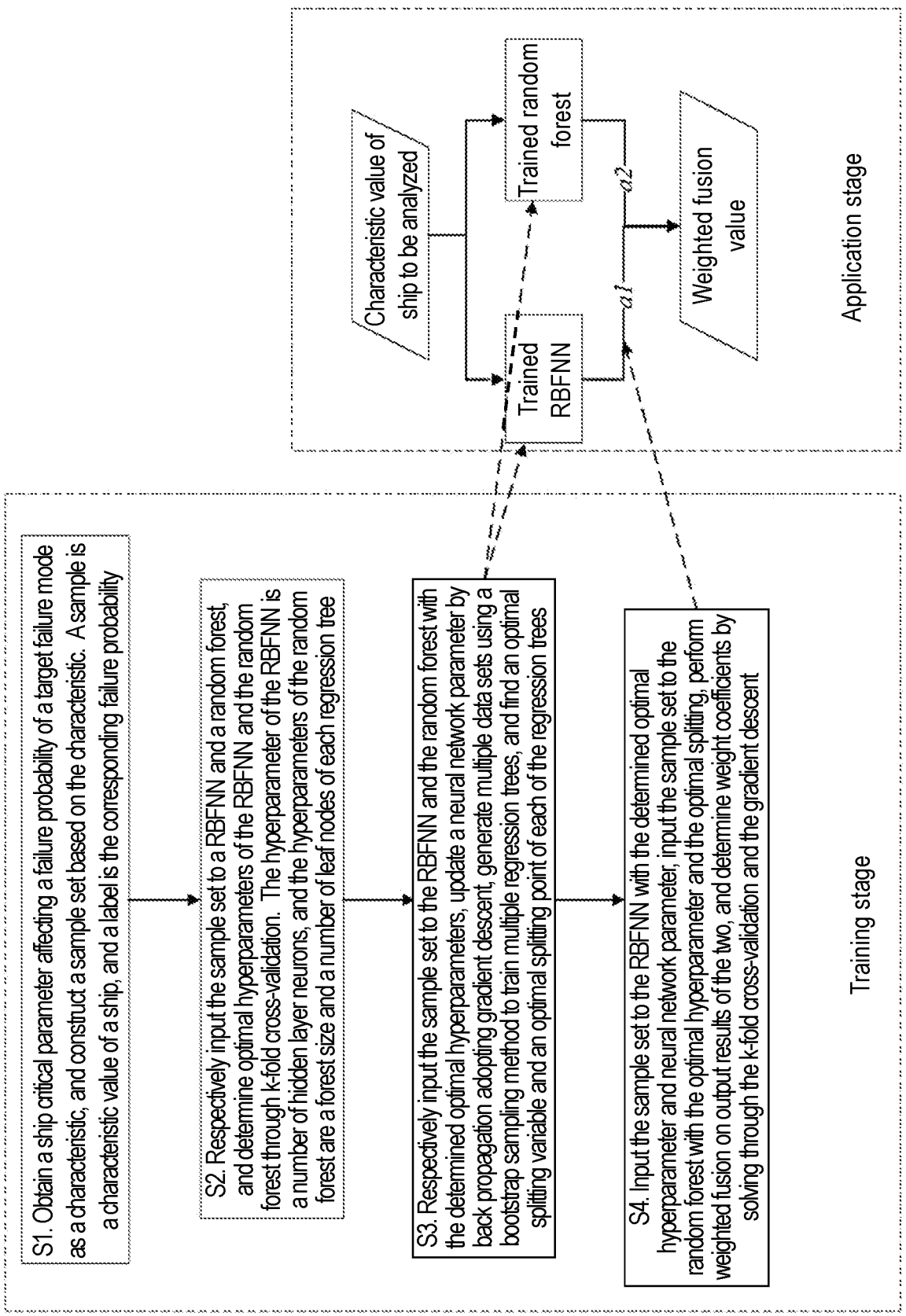

METHOD AND SYSTEM FOR SHIP STABILITY PREDICTION BY WEIGHTED FUSION OF RADIAL BASIS FUNCTION NEURAL NETWORK AND RANDOM FOREST BASED ON GRADIENT DESCENT

CROSS-REFERENCE TO RELATED APPLICATION

This application claims the priority benefit of China application serial no. 202211737520.1, filed on Dec. 31, 2022. The entirety of the above-mentioned patent application is hereby incorporated by reference herein and made a part of this specification.

BACKGROUND

Technical Field

The disclosure belongs to the field of ship stability prediction, and more specifically relates to a method and a system for ship stability prediction by weighted fusion of radial basis function neural network (RBFNN) and random forest (RF) based on gradient descent (GD).

Description of Related Art

With the development and progress of the world, the connections between countries are getting closer and closer. In order to promote common economic development, trade and exchanges between countries are becoming more active, followed by closer marine economic ties, which also greatly promotes the development of the marine industry. Sea transportation has a series of advantages such as large transportation volume and low price. However, due to the uncertainty of wind and waves in the marine environment, the marine industry is affected to a certain extent. At the same time, ship operators must also consider ship safety issues.

As the most important part of ship safety performance, stability has always attracted much attention. The International Maritime Organization (IMO) is a United Nations organization specifically responsible for the maritime navigation safety of ships, etc. and has long been committed to formulating rules related to ship stability and safety. The subcommittee on Stability and Load Lines and on Fishing Vessels Safety (SLF) completed the formulation of the first edition of the code on intact stability in 2008, which is named the "2008 International Code on Intact Stability". The International Maritime Organization adopted static principles to analyze ship movement and completed the formulation of the code according to empirical formulas and statistical data. Therefore, the complexity of sea conditions and environments during ship navigation cannot be effectively reflected, and whether a ship will suffer dynamic stability failure in waves cannot be sufficiently determined, so the SLF began to develop the second edition of the code on intact stability.

The current assessment methods for the second edition of intact stability of ships can be divided as follows. For Level 1 vulnerability criteria assessment, although the method is simple to calculate, the calculation accuracy is insufficient. For Level 2 vulnerability criteria assessment, parameters such as roll damping, steady heel angle, and resistance need to be calculated by the probability method in the mathematical model chosen for the method. The calculation process is cumbersome and requires the hull shape line of the entire ship as input. For Level 3 direct stability assessment, although the method has high calculation accuracy, experimental support is required. If the ship can pass the assessments of Level 1 and Level 2, the assessment of Level 3 is not necessary.

SUMMARY

In view of the shortcomings of the prior art, objectives of the disclosure are to provide a method and a system for ship stability prediction by weighted fusion of RBFNN and random forest based on GD, which aim to solve the issues of existing prediction methods with many input parameters, complex calculations, and long time-consumption.

In order to achieve the above objective, in a first aspect, the disclosure provides a method for ship stability prediction by weighted fusion of RBFNN and random forest based on GD. The method includes the following.

A training stage includes the following.

In Step S1, a ship critical parameter affecting a failure probability of a target failure mode is obtained as a characteristic, and a sample set is constructed based on the characteristic. A sample is a characteristic value of a ship, and a label is the corresponding failure probability.

In Step S2, the sample set is respectively input to the RBFNN and the random forest, and optimal hyperparameters of the RBFNN and the random forest are determined through k-fold cross-validation. The hyperparameter of the RBFNN is a number of hidden layer neurons, and the hyperparameters of the random forest are a forest size and a number of leaf nodes of each regression tree.

In Step S3, the sample set is respectively input to the RBFNN and the random forest with the determined optimal hyperparameters, a neural network parameter is updated by back propagation adopting the gradient descent, multiple data sets are generated using a bootstrap sampling method to train multiple regression trees, and an optimal splitting variable and an optimal splitting point of each of the regression trees are found.

In Step S4, the sample set is input to the RBFNN with the determined optimal hyperparameter and neural network parameter, the sample set is input to the random forest with the optimal hyperparameter and the optimal splitting, weighted fusion is performed on output results of the two, and weight coefficients are determined by solving through the k-fold cross-validation and the gradient descent.

An application stage includes the following.

The characteristic value of a ship to be analyzed is obtained and is respectively input to the trained RBFNN and the trained random forest. A weighted fusion value of the output results of the two is a stability prediction result of the ship to be analyzed in the target failure mode.

Preferably, Step S1 includes the following.

In Step S11, full-parameter modeling is performed on the ship. Parameters include a main scale parameter, a shape parameter, a load parameter, and a navigational parameter of the ship.

In Step S12, a certain parameter is changed while ensuring that other parameters remain unchanged, and the failure probability in the target failure mode is calculated according to a second edition of code on intact stability.

In Step S13, when a change amount of the failure probability does not exceed a preset threshold before and after changing the parameter, the parameter is determined as a ship non-critical parameter; otherwise, the parameter is determined as the ship critical parameter.

In Step S14, the ship critical parameter is obtained by nondimensionalization processing, and processed parameters are jointly used as characteristics.

Preferably, the failure mode is excessive acceleration, dead ship stability, surf-riding/broaching, or pure loss of stability.

Preferably, a type of the ship is a fishing boat, a fishery administration ship, or a container ship.

Preferably, an optimization objective function in Step S2 is to minimize a mean square error of k times of validation, and a calculation equation is as follows:

$$\text{Min } e_{k\_MSE} = \frac{1}{k}\sum_{k=1}^{k}\frac{1}{d}\sum_{i=1}^{d}e_i^2$$

where k represents a number of divisions of a training set, d represents a number of samples of a validation set, and $e_i$ represents an absolute error of a prediction result of each sample, that is, a difference value between a prediction result of the RBFNN/random forest and an actual result.

Preferably, the network parameters of the RBFNN include a radial basis function data center, a height of a Gaussian kernel, and a connection weight, and update equations are as follows:

$$\begin{cases} c_{j+1} = c_j - \eta \frac{\partial e_{k\_MSE}}{\partial c_j} \\ \delta_{j+1} = \delta_j - \eta \frac{\partial e_{k\_MSE}}{\partial \delta_j} \\ \omega_{j+1} = \omega_j - \eta \frac{\partial e_{k\_MSE}}{\partial \omega_j} \end{cases}$$

where $c_j$ represents the radial basis function data center, $\delta_j$ represents a width of the Gaussian kernel, $\omega_j$ represents the connection weight, $\eta$ represents a learning probability, and $e_{k\_MSE}$ represents a mean value of a mean square error of k times of validation.

Preferably, an optimization objective function in Step S4 is to minimize a mean value of a mean square error of prediction results of all validation sets, and a calculation equation is as follows:

$$\text{Min}E = \frac{1}{K}\sum_{k=1}^{K}[e_{mse\_k}]$$

$$e_{mse\_k} = \frac{1}{M}\sum_{m=1}^{M}[a_1 y_{RBF}(x_m) + a_2 y_{RF}(x_m) - y_m]$$

where K represents a number of validation sets, M represents a number of samples in a validation set, $e_{mse\_k}$ represents a mean square error of a k-th validation set, $a_1$ represents the weight coefficient of the RBFNN, $a_2$ represents the weight coefficient of the random forest, and $a_1+a_2=1$, $x_m$ represents an m-th sample, $y_{RBF}$() represents the prediction result of the RBFNN; $y_{RF}$() represents the prediction result of the random forest, and $y_m$ represents a true failure probability corresponding to the m-th sample.

Preferably, update strategies of the weight coefficients $a_1$ and $a_2$ are as follows:

$$\begin{cases} a_1 = a_1 - \eta \frac{\partial E}{\partial a_1} & \text{if } rand(0,1) \geq 0.5 \\ a_2 = a_2 - \eta \frac{\partial E}{\partial a_2} & \text{if } rand(0,1) < 0.5 \end{cases}$$

where $\eta$ represents a learning probability.

In order to achieve the above objective, in a second aspect, the disclosure provides a system for ship stability prediction by weighted fusion of RBFNN and random forest based on GD, which includes a processor and a memory. The memory is configured to store a computer execution instruction. The processor is configured to execute the computer execution instruction, so that the method according to the first aspect is executed.

BRIEF DESCRIPTION OF THE DRAWINGS

FIGURE is a flowchart of a method for ship stability prediction by weighted fusion of RBFNN and random forest based on GD according to the disclosure.

DESCRIPTION OF THE EMBODIMENTS

In order for the objectives, technical solutions, and advantages of the disclosure to be clearer, the disclosure will be further described in detail below in combination with the drawings and embodiments. It should be understood that the specific embodiments described here are only used to explain the disclosure and are not intended to limit the disclosure.

As shown in FIGURE, the disclosure provides a method for ship stability prediction by weighted fusion of RBFNN and random forest based on GD. The method includes the following steps.

In Step 1, based on prior knowledge, different ship parameters are selected as input characteristics for prediction of different failure modes.

The disclosure filters the input characteristics in advance and ignores irrelevant characteristics to prevent dimensionality explosion and ease learning tasks.

In order to reduce the computational complexity of a machine learning prediction method, the ship parameters when predicting failure probabilities of different failure modes are determined through prior knowledge, that is, through sensitivity analysis. Analysis parameters include ship main scale parameters including ship length, ship width, molded depth, and draft; hull shape parameters including square coefficient, water plane coefficient, and mid-cross section coefficient; load parameters including height of center of gravity, and other parameters including angle of entrance and navigational speed. First, full-parameter modeling is performed on multiple ships of the same type or different types. The modeling method can effectively ensure the implementation of a control variable method. Then, a certain ship parameter is changed while ensuring that other ship parameters remain unchanged. The failure probability of each failure mode is calculated according to a second edition of code on intact stability. A variation range of each parameter is shown in Table 1.

TABLE 1

Variation range of each ship parameter

| Ship parameter | Corresponding symbol/unit | Variation range |
|---|---|---|
| Length between perpendiculars | $L_{PP}$/m | 48.6~110 |
| Molded width | B/m | 8~16.95 |
| Molded depth | D/m | 3.9~10 |
| Draft | T/m | 2.85~5.2 |
| Square factor | $C_B$ | 0.5173~0.6964 |
| Mid-cross section coefficient | $C_m$ | 0.7314~0.9788 |
| Water plane coefficient | $C_w$ | 0.769~0.8242 |
| Height of center of gravity | $Z_g$/m | 2.503~6.425 |
| Service navigational speed | $V_{Serv}$/m/s | 8.230~17 |
| Angle of entrance | $\varphi_f/°$ | 41.54~65.7 |
| Longitudinal center of buoyancy/ship length | $X_b/L$ | 0.4~0.6 |

If a ship parameter does not affect the failure probability of each failure mode before and after the change, the ship parameter is eliminated from the input characteristics. Finally, the embodiment focuses on three ship types, a fishing boat, a fishery administration ship, and a container ship. The selections of the input characteristic of the machine learning prediction method for each failure mode are shown in Table 2.

TABLE 2

Input characteristic of prediction method

| Failure mode | Input characteristic |
|---|---|
| Excessive acceleration | $B/T_m$, $T_m$, $Z_g$, $C_B$, $C_w$, $C_m$, $X_b/L$ |
| Dead ship stability | $B/T_m$, $D/T_m$, $T_m$, $Z_g$, $C_B$, $C_w$, $C_m$, $\phi_r * \pi/180$ |
| Surf-riding/broaching | $L/B$, $B/T_m$, $T_m$, $Z_g$, $C_B$, $C_w$, $F_n$ |
| Pure loss of stability | $L/B$, $B/T_m$, $D/T_m$, $T_m Z_g$ |

The meaning of each symbol is as follows: L: ship length; B: ship molded width; D: ship molded depth; $T_m$: ship draft; $Z_g$: height of center of gravity; $C_B$: square coefficient; $C_w$: water plane coefficient; $C_m$: mid-cross section coefficient; $\phi_r$: angle of entrance; $F_n$: Froude number; $X_b$: longitudinal center of buoyancy; and/represents division. Some parameters are subjected to nondimensionalization processing.

In Step 2, the number of hidden layer neurons of a neural network, the forest size of the random forest, and the number of leaf nodes of each regression tree are selected through k-fold cross-validation.

The setting of the number of hidden layer nodes (that is, the number of neurons) of the RBFNN directly affects the performance of the network. Using too few neurons in the hidden layer causes underfitting. When the neural network has too many nodes, the limited amount of information contained in a training set is not enough to train all neurons in the hidden layer, which causes overfitting. Obviously, selecting an appropriate number of hidden layer neurons is crucial. Similarly, two important parameters need to be determined for the random forest algorithm, which are respectively the number of leaf nodes and the number of trees (the forest size).

The disclosure adopts the Gaussian function as the radial basis function, and a calculation equation is as follows:

$$\varphi(r) = e^{-\frac{r^2}{2\delta^2}}$$

where r is a distance from a characteristic vector to a data center, and $\delta$ is an expansion constant.

When ship stability is predicted using the RBFNN obtained after training, a prediction result may be obtained using parameters such as ship length, ship width, molded depth, and navigational speed as input according to the failure mode selected for prediction. A calculation equation as follows:

$$y_{RBF}(x) = \sum_{p=1}^{P} \omega_p \varphi(\|c - x\|)$$

where is x the input characteristic, $\omega_p$ is a weight coefficient from a hidden layer to an output layer, and c is the data center of the radial basis function.

The random forest algorithm adopts an averaging method to combine predicted outputs. The prediction result may be obtained using parameters such as ship length, ship width, molded depth, and navigational speed as input characteristics according to the predicted failure mode by adopting different random forests. A calculation method is as follows:

$$y_{RF}(x) = \frac{1}{T}\sum_{i=1}^{T} h_i(x)$$

where $h_i(x)$ is the prediction result of a single regression tree.

In order to prevent the machine learning algorithm from overfitting, which causes the prediction accuracy on the training set to become higher and higher as the number of times of training increases, but causes the prediction accuracy for prediction samples outside the training set to decrease, the disclosure divides a sample set into the training set and a test set. During the training process, the training set is divided into k parts, k−1 parts are selected each time as the training set to train the algorithm, and the one remaining part is used as a validation set. After k times of training and validation, the mean value of the mean square error of k times of validation is used as an evaluation index for the performance of the prediction method. A calculation equation is as follows:

$$e_{k-MSE} = \frac{1}{k}\sum_{k=1}^{k}\frac{1}{d}\sum_{i=1}^{d} e_i^2$$

where d is the number of samples in the validation set; $e_i$ is an absolute error of a prediction result of each sample, that is, an interpolation between the prediction result and an actual result, and k is the number of divisions of the training set.

An optimization range of the number of neurons is 5 to 200, an optimization range of the number of leaf nodes is 5 to 500, and an optimization range of the number of trees is 0 to 800.

Finally, different prediction network structures and random forest parameters for different failure modes are shown in Table 3 and Table 4.

TABLE 3

Prediction network structure of each failure mode

| Failure mode | Number of input nodes | Number of hidden nodes | Number of output nodes |
|---|---|---|---|
| Excessive acceleration | 6 | 10 | 1 |
| Dead ship stability | 8 | 13 | 1 |
| Surf-riding/broaching | 7 | 19 | 1 |
| Pure loss of stability | 5 | 11 | 1 |

TABLE 4

Selection of RF algorithm parameter corresponding to each mode

| Failure mode | Number of leaf nodes | Number of trees |
|---|---|---|
| Excessive acceleration | 5 | 5 |
| Dead ship stability | 5 | 10 |
| Surf-riding/broaching | 5 | 10 |
| Pure loss of stability | 5 | 15 |

In Step 3, the parameters of the neural network are updated according to gradient through back error propagation, and multiple data sets are generated using a bootstrap sampling method to train multiple regression trees.

The data center of the radial basis function adopts supervised learning selection to ensure that the data center is continuously updated as the network is being trained. The weights between the hidden layer and the output layer and the radial basis width of the radial basis function are updated using the gradient descent. At the same time, in order to prevent the algorithm from falling into a local minimum, a learning rate η is introduced. Update equations of a radial basis function data center $c_j$, a width $\delta_j$ of a Gaussian kernel, and a connection weight $\omega_j$ are as follows:

$$\begin{cases} c_{j+1} = c_j - \eta \frac{\partial e_{k\_MSE}}{\partial c_j} \\ \delta_{j+1} = \delta_j - \eta \frac{\partial e_{k\_MSE}}{\partial \delta_j} \\ \omega_{j+1} = \omega_j - \eta \frac{\partial e_{k\_MSE}}{\partial \omega_j} \end{cases}$$

Multiple random data sets are obtained through the bootstrapping sampling method, and a regression tree is trained according to each data set. The training method of a single regression tree is as follows.

A j-th variable $x^{(j)}$ and a value thereof are selected as a splitting variable and a splitting point, and two regions are defined as follows:

$R_1(j,s) = \{x|x^{(j)} \leq s\}$ $R_2(j,s) = \{x|x^{(j)} > s\}$

Then, an optimal splitting variable j and an optimal splitting point s are found, that is, solve:

$$\min_{j,s}\left[\min_{c_1}\sum_{x_i \in R_1(j,s)}(y_i - c_1)^2 + \min_{c_2}\sum_{x_i \in R_2(j,s)}(y_i - c_2)^2\right]$$

The optimal splitting point s may be found for the fixed input variable j.

The selected optimal splitting variable j and optimal splitting point s are used to divide the regions and determine corresponding output values:

$\hat{c}_1 = ave(y_i|x_i \in R_1(j,s))$ and $\hat{c}_2 = ave(y_i|x_i \in R_2(j,s))$ All input variables are traversed and the optimal splitting variable j is found to form a pair (j, s). Accordingly, an input space is divided into two regions. Then, the above dividing process is repeated for each region until a stopping condition is satisfied.

If the input space is divided into M regions, and there is a fixed output value $\hat{c}_m$ in each region $R_M$, a regression tree model may be expressed as:

$$f(x) = \sum_{m=1}^{M} \hat{c}_m I(x \in R_M)$$

In Step 4, the weight coefficients are introduced to fuse the prediction results of the random forest algorithm and the RBFNN. The weight coefficient adopts the gradient descent for optimization.

Weighted fusion of the prediction results of the neural network and the random forest is performed through introducing the weight coefficients. A new prediction result calculation equation is as follows:

$$y_{comb} = a_1 y_{RBF}(x_k) + a_2 y_{RF}(x_k)$$

where is $y_{comb}$ a new prediction result, $x_k$ is input data, $y_{RBF}(x_k)$ is the prediction result of the RBFNN, $y_{RF}(x_k)$ is the prediction result of the RF algorithm; and $a_1$ and $a_2$ are respectively the weight coefficients, and $a_1 + a_2 = 1$ needs to be satisfied.

In order to optimize the size of the weight coefficient, the mean square error of the k-fold cross-validation is used as an objective function, and the gradient descent is used for iteration. Firstly, the training set is randomly shuffled, and then divided into K parts, K−1 parts are selected each time as the training set, and a K-th part is used as the validation set to ensure that each part is used and only used once as the validation set. Finally, the mean value of the mean square error of the prediction results of all validation sets is taken as an optimization objective function.

The objective function is as follows:

$$\text{Min} E = \frac{1}{K}\sum_{k=1}^{K}[e_{mse\_k}]$$

where K is the number of k-fold cross-validation, and $e_{mse\_k}$ is a mean square error of a K-th validation set.

$$e_{mse\_k} = \frac{1}{M}\sum_{m=1}^{M}[a_1 y_{RBF}(x_m) + a_2 y_{RF}(x_m) - y_m]$$

where M is the number of samples of the validation set, and is $y_m$ a true output.

Since $a_1$ and $a_2$ need to satisfy $a_1 + a_2 = 1$, the value of one of the two may always be obtained according to the value of the other one. Therefore, during each update, one of $a_1$ and $a_2$ is selected for update with a certain probability, and the other is obtained through calculation. Update strategies are as follows:

$$\begin{cases} a_1 = a_1 - \eta \frac{\partial E}{\partial a_1} & \text{if } rand(0,1) \geq 0.5 \\ a_2 = a_2 - \eta \frac{\partial E}{\partial a_2} & \text{if } rand(0,1) < 0.5 \end{cases}$$

In order to validate the reliability of the proposed machine learning prediction method, the prediction method is trained by constructing a ship stability data set. During the training process, 8 ships are randomly selected and not added to the training set for each failure mode to validate prediction accuracy.

The prediction results and corresponding expected values by three algorithms for failure probabilities of surf-riding/broaching corresponding to different ship types are shown in Table 5.

TABLE 5

Prediction result and corresponding expected value by each algorithm for failure probability of surf-riding/broaching

| Prediction sample | Ship length/width | Ship width/draft | Draft | Square coefficient | Water plane coefficient | Froude number | Expected value | Prediction result of RF | Prediction result of RBF | Prediction result of fusion algorithm |
|---|---|---|---|---|---|---|---|---|---|---|
| 1 | 6.46538461 | 2.44744273 | 3.187 | 0.545 | 0.8311 | 0.3932 | 0.04713 | 0.05366 | 0.04423 | 0.04732 |
| 2 | 6.15384615 | 2.50862880 | 3.187 | 0.545 | 0.8311 | 0.398 | 0.05055 | 0.05102 | 0.05 | 0.05041 |
| 3 | 6.46538461 | 2.44744273 | 3.187 | 0.545 | 0.8311 | 0.3746 | 0.0321 | 0.05005 | 0.0351 | 0.03528 |
| 4 | 6.62307692 | 2.44744273 | 3.187 | 0.558 | 0.8311 | 0.3746 | 0.02934 | 0.05162 | 0.03499 | 0.03364 |
| 5 | 5.77125 | 2.80701754 | 2.85 | 0.491 | 0.8242 | 0.3534 | 0.03777 | 0.03951 | 0.03575 | 0.03605 |
| 6 | 5.923125 | 2.80701754 | 2.85 | 0.504 | 0.8242 | 0.3534 | 0.03455 | 0.04039 | 0.03307 | 0.03448 |
| 7 | 6.226875 | 2.80701754 | 2.85 | 0.529 | 0.8242 | 0.3534 | 0.02775 | 0.03449 | 0.03043 | 0.02895 |
| 8 | 6.37875 | 2.80701754 | 2.85 | 0.542 | 0.8242 | 0.3534 | 0.02441 | 0.03133 | 0.02898 | 0.02858 |

The prediction results and corresponding expected values by three algorithms for failure probabilities of pure loss of stability corresponding to different ship types are shown in Table 6.

TABLE 6

Prediction result and corresponding expected value by each algorithm for failure probability of pure loss of stability

| Prediction sample | Ship length/width | Ship width/draft | Molded depth/draft | Height of center of gravity/molded depth | Draft | Expected value | Prediction result of fusion algorithm |
|---|---|---|---|---|---|---|---|
| 1 | 5.90990991 | 2.775 | 1.75 | 0.62085714 | 4 | 0.002206 | 0.00247 |
| 2 | 6.075 | 2.80701754 | 1.5087719 | 0.76744186 | 2.85 | 0.036076 | 0.03409 |
| 3 | 5.90990991 | 2.49606476 | 1.5740948 | 0.62085714 | 4.447 | 0.010704 | 0.0108 |
| 4 | 6.307692308 | 2.4375 | 1.21875 | 0.90769230 | 3.2 | 0.302279 | 0.26799 |
| 5 | 6.489675516 | 3.25961538 | 1.9230769 | 0.7 | 5.2 | 0.028743 | 0.03241 |
| 6 | 5.75489078 | 2.56330110 | 1.5740948 | 0.62085714 | 4.447 | 0.0322 | 0.02817 |
| 7 | 5.90990991 | 2.496064763 | 1.53474252 | 0.636776557 | 4.447 | 0.0322 | 0.03759 |
| 8 | 6.307692308 | 2.4375 | 1.18828125 | 0.899408284 | 3.2 | 0.097027 | 0.09176 |

The prediction results and corresponding expected values by three algorithms for failure probabilities of excessive acceleration corresponding to different ship types are shown in Table 7.

TABLE 7

Prediction result and corresponding expected value by each algorithm for failure probability of excessive acceleration

| Prediction sample | Ship width/draft | Draft | Height of center of gravity | Square coefficient | Water plane coefficient | Mid-cross section coefficient | Longitudinal center of buoyancy/ship length | Expected value | Prediction result of fusion algorithm |
|---|---|---|---|---|---|---|---|---|---|
| 1 | 2.80701 | 2.85 | 2.628 | 0.514 | 0.8242 | 0.7314 | 0.4765432 | 0.008224 | 0.00864 |
| 2 | 2.49606 | 4.447 | 4.501 | 0.693 | 0.834 | 0.9645 | 0.4906097 | 2.28E−11 | 2.03E−11 |
| 3 | 3.25961 | 5.2 | 6.746 | 0.653 | 0.769 | 0.9788 | 0.4760909 | 5.30E−08 | 5.7E−8 |
| 4 | 2.87719 | 2.85 | 2.503 | 0.514 | 0.8242 | 0.7314 | 0.4765432 | 0.009567 | 0.00928 |

TABLE 7-continued

Prediction result and corresponding expected value by each algorithm for failure probability of excessive acceleration

| Prediction sample | Ship width/draft | Draft | Height of center of gravity | Square coefficient | Water plane coefficient | Mid-cross section coefficient | Longitudinal center of buoyancy/ship length | Expected value | Prediction result of fusion algorithm |
|---|---|---|---|---|---|---|---|---|---|
| 5 | 2.51019 | 3.187 | 3.42 | 0.532 | 0.831 | 0.8805 | 0.4786585 | 0.000426 | 4.24736E−4 |
| 6 | 2.80701 | 2.85 | 2.503 | 0.529 | 0.842 | 0.7314 | 0.4765432 | 0.009162 | 0.00907 |
| 7 | 2.80701 | 2.85 | 2.503 | 0.514 | 0.8242 | 0.7314 | 0.4569958 | 0.007829 | 0.00857 |
| 8 | 2.44744 | 3.187 | 3.42 | 0.532 | 0.831 | 0.8805 | 0.4418699 | 0.000227 | 2.35644E−4 |

The prediction results and corresponding expected values by three algorithms for failure probabilities of dead ship stability corresponding to different ship types are shown in Table 8.

TABLE 8

Prediction result and corresponding expected value by each algorithm for failure probability of dead ship stability

| Prediction sample | Ship width/draft | Molded depth/draft | Draft | Height of center of gravity | Square coefficient | Water plane coefficient | Mid-cross section coefficient | Angle of entrance*π/180 | Expected value | Prediction result of fusion algorithm |
|---|---|---|---|---|---|---|---|---|---|---|
| 1 | 2.807017 | 1.508771 | 2.85 | 2.566 | 0.514 | 0.8242 | 0.7314 | 0.724642 | 0.06844 | 0.06713 |
| 2 | 2.807017 | 1.508771 | 2.85 | 2.503 | 0.528596 | 0.8242 | 0.7314 | 0.724642 | 0.06152 | 0.0621 |
| 3 | 2.877192 | 1.508771 | 2.85 | 2.503 | 0.526850 | 0.8242 | 0.7314 | 0.724642 | 0.05914 | 0.06028 |
| 4 | 2.687651 | 1.694915 | 4.13 | 4.287 | 0.710708 | 0.834 | 0.9645 | 0.837333 | 0.002037 | 0.00232 |
| 5 | 2.687651 | 1.738498 | 4.13 | 4.287 | 0.687987 | 0.834 | 0.9645 | 0.837333 | 0.001669 | 0.00191 |
| 6 | 2.385321 | 1.192660 | 3.27 | 3.42 | 0.551812 | 0.831 | 0.8805 | 0.837333 | 0.01883 | 0.0208 |
| 7 | 2.445141 | 1.222570 | 3.19 | 3.42 | 0.559 | 0.873 | 0.8805 | 0.837333 | 0.0193 | 0.01848 |
| 8 | 3.180112 | 1.876172 | 5.33 | 6.425 | 0.672751 | 0.769 | 0.9788 | 0.837333 | 0.002649 | 0.00272 |

From the comparison of the above prediction results, it can be seen that although the prediction by the RBFNN can already relatively accurately predict the probability of surf-riding/broaching of the ship, there may still be large deviations in the prediction of some samples. When predicting through the fusion algorithm, the results with large deviations are corrected, so that the prediction results are closer to the expected values.

In order to more intuitively validate the effect of the disclosure, calculation results of mean square error (MSE) and mean absolute percentage error (MAPE) of each prediction method are shown in Table 9 and Table 10. The results also validate that the ship stability machine learning prediction algorithm proposed by the disclosure based on gradient descent fusion is better than the two machine learning algorithms before improvement.

TABLE 9

MSE calculation result of each algorithm

| Failure mode | RF algorithm | RBFNN | Fusion algorithm |
|---|---|---|---|
| Excessive acceleration | 3.73512E−07 | 5.39598E−08 | 1.00599E−08 |
| Dead ship stability | 6.30924E−06 | 4.07945E−06 | 2.73048E−06 |
| Surf-riding/broaching | 0.000123995 | 1.05E−05 | 6.3157E−06 |
| Pure loss of stability | 0.000367769 | 0.000124579 | 0.000158298 |

TABLE 10

MAPE calculation result of each algorithm

| Failure mode | RF algorithm | RBFNN | Fusion algorithm |
|---|---|---|---|
| Excessive acceleration | 35.57 | 10.79 | 5.108 |
| Dead ship stability | 24.60 | 11.89 | 6.313 |
| Surf-riding/broaching | 27.59 | 9.232 | 6.429 |
| Pure loss of stability | 25.46 | 18.14 | 9.63 |

Generally speaking, compared with the prior art, the above technical solutions conceived by the disclosure have the following beneficial effects.

The disclosure provides the method and the system for ship stability prediction by weighted fusion of RBFNN and random forest based on GD. Firstly, through calculating and analyzing the sensitivity of the failure probability of ship stability to ship parameters such as the ship type parameter, the load parameter, and the navigational parameter, the input characteristics when predicting the failure probabilities under different failure modes are determined through prior knowledge. The two nonlinear regressors, the random forest and the radial basis function neural network, are selected as the base learners for subsequent integrated machine learning. Secondly, the mean square error of the k-fold cross-validation is used as the performance evaluation criterion of the two prediction methods to search for the algorithm model capacities of the radial basis function neural network and the random forest, that is, to determine the number of network neurons, the forest size, and the number of leaf nodes of each regression tree suitable for prediction of different stability failure modes. The data center, the radial basis width, and the connection weight of the RBFNN are updated by adopting the supervised learning method. Multiple random sample sets are generated using the bootstrap sampling method and are parallelly trained to generate the regression trees. A Gini index is used as an attribute division index, and the prediction result of the random forest is obtained using an averaging method. Finally, the weight coefficients are introduced for weighted combination of the prediction results of the radial basis function neural network and the random forest. The weight coefficient is obtained by solving through iterative optimization of the gradient descent. In order to prevent subjective factors caused by manual division of the validation sets, the mean square error of the k-fold cross-validation is adopted as the optimization objective function. The disclosure uses a small number of ship parameters to accurately predict the failure probabilities of four failure modes of ship stability while preventing a complex calculation process.

It is easy for persons skilled in the art to understand that the above descriptions are only preferred embodiments of the disclosure and are not intended to limit the disclosure. Any modifications, equivalent substitutions, improvements, etc., made within the spirit and principle of the disclosure should be included in the protection scope of the disclosure.

What is claimed is:

1. A method for ship stability prediction by weighted fusion of radial basis function neural network (RBFNN) and random forest based on gradient descent, the method comprising:
    a training stage, comprising:
    Step S1 of obtaining a ship critical parameter affecting a failure probability of a target failure mode is as a characteristic, and constructing a sample set based on the characteristic, wherein a sample is a characteristic value of a ship, and a label is the corresponding failure probability;
    Step S2 of respectively inputting the sample set to the RBFNN and the random forest, and determining optimal hyperparameters of the RBFNN and the random forest through k-fold cross-validation, wherein the hyperparameter of the RBFNN is a number of hidden layer neurons, and the hyperparameters of the random forest are a forest size and a number of leaf nodes of each regression tree;
    Step S3 of respectively inputting the sample set to the RBFNN and the random forest with the determined optimal hyperparameters, updating a neural network parameter by back propagation adopting the gradient descent, generating a plurality of data sets using a bootstrap sampling method to train a plurality of regression trees, and finding an optimal splitting variable and an optimal splitting point of each of the regression trees; and
    Step S4 of inputting the sample set to the RBFNN with the determined optimal hyperparameter and network parameter, inputting the sample set to the random forest with the optimal hyperparameter and the optimal splitting, performing weighted fusion on output results of the two, and determining weight coefficients by solving through the k-fold cross-validation and the gradient descent; and
    an application stage, comprising:
    obtaining the characteristic value of a ship to be analyzed and respectively inputting the characteristic value to the trained RBFNN and the trained random forest, wherein a weighted fusion value of the output results of the two is a stability prediction result of the ship to be analyzed in the target failure mode.

2. The method according to claim 1, wherein Step S1 comprises:
    Step S11 of performing full-parameter modeling on the ship, wherein parameters comprise a main scale parameter, a shape parameter, a load parameter, and a navigational parameter of the ship;
    Step S12 of changing a certain parameter while ensuring that other parameters remain unchanged, and calculating the failure probability in the target failure mode according to a second edition of code on intact stability;
    Step S13 of when a change amount of the failure probability does not exceed a preset threshold before and after changing the parameter, determining the parameter as a ship non-critical parameter; otherwise, determining the parameter as the ship critical parameter; and
    Step S14, obtaining the ship critical parameter by nondimensionalization processing, and jointly using processed parameters as characteristics.

3. A system for ship stability prediction by weighted fusion of RBFNN and random forest based on gradient descent, comprising a processor and a memory, wherein
    the memory is configured to store a computer execution instruction; and
    the processor is configured to execute the computer execution instruction, so that the method according to claim 2 is executed.

4. The method according to claim 1, wherein the failure mode is excessive acceleration, dead ship stability, surf-riding/broaching, or pure loss of stability.

5. A system for ship stability prediction by weighted fusion of RBFNN and random forest based on gradient descent, comprising a processor and a memory, wherein
    the memory is configured to store a computer execution instruction; and
    the processor is configured to execute the computer execution instruction, so that the method according to claim 4 is executed.

6. The method according to claim 1, wherein a type of the ship is a fishing boat, a fishery administration ship, or a container ship.

7. A system for ship stability prediction by weighted fusion of RBFNN and random forest based on gradient descent, comprising a processor and a memory, wherein
    the memory is configured to store a computer execution instruction; and
    the processor is configured to execute the computer execution instruction, so that the method according to claim 6 is executed.

8. The method according to claim 1, wherein the network parameters of the RBFNN comprise a radial basis function data center, a height of a Gaussian kernel, and a connection weight, and update equations are as follows:

$$\begin{cases} c_{j+1} = c_j - \eta \dfrac{\partial e_{k\_MSE}}{\partial c_j} \\ \delta_{j+1} = \delta_j - \eta \dfrac{\partial e_{k\_MSE}}{\partial \delta_j} \\ \omega_{j+1} = \omega_j - \eta \dfrac{\partial e_{k\_MSE}}{\partial \omega_j} \end{cases}$$

where $c_j$ represents the radial basis function data center, $\delta_j$ represents a width of the Gaussian kernel, $\omega_j$ represents the connection weight, η represents a learning probability, and $e_{k\_MSE}$ represents a mean value of a mean square error of k times of validation.

9. A system for ship stability prediction by weighted fusion of RBFNN and random forest based on gradient descent, comprising a processor and a memory, wherein
the memory is configured to store a computer execution instruction; and
the processor is configured to execute the computer execution instruction, so that the method according to claim 8 is executed.

10. The method according to claim 1, wherein an optimization objective function in Step S4 is to minimize a mean value of a mean square error of prediction results of all validation sets, and a calculation equation is as follows:

$$\text{Min}E = \frac{1}{K}\sum_{k=1}^{K}[e_{mse\_k}]$$

$$e_{mse\_k} = \frac{1}{M}\sum_{m=1}^{M}[a_1 y_{RBF}(x_m) + a_2 y_{RF}(x_m) - y_m]$$

where M represents a number of samples in a validation set, $e_{mse\_k}$ represents a mean square error of a k'-th validation set, $a_1$ represents the weight coefficient of the RBFNN, $a_2$ represents the weight coefficient of the random forest, and $a_1+a_2=1$, $x_m$ represents an m-th sample, $y_{RBF}(x_m)$ represents the prediction result of the RBFNN; $y_{RF}(x_m)$ represents the prediction result of the random forest, and $y_m$ represents a true failure probability corresponding to the m-th sample.

11. The method according to claim 10, wherein update strategies of the weight coefficients $a_1$ and $a_2$ are as follows:

$$\begin{cases} a_1 = a_1 - \eta \frac{\partial E}{\partial a_1} & \text{if } rand(0,1) \geq 0.5 \\ a_2 = a_2 - \eta \frac{\partial E}{\partial a_2} & \text{if } rand(0,1) < 0.5 \end{cases}$$

where η represents a learning probability.

12. A system for ship stability prediction by weighted fusion of RBFNN and random forest based on gradient descent, comprising a processor and a memory, wherein
the memory is configured to store a computer execution instruction; and
the processor is configured to execute the computer execution instruction, so that the method according to claim 11 is executed.

13. A system for ship stability prediction by weighted fusion of RBFNN and random forest based on gradient descent, comprising a processor and a memory, wherein
the memory is configured to store a computer execution instruction; and
the processor is configured to execute the computer execution instruction, so that the method according to claim 10 is executed.

14. A system for ship stability prediction by weighted fusion of RBFNN and random forest based on gradient descent, comprising a processor and a memory, wherein
the memory is configured to store a computer execution instruction; and
the processor is configured to execute the computer execution instruction, so that the method according to claim 1 is executed.

* * * * *